US007353329B2

(12) United States Patent
Ellis et al.

(10) Patent No.: US 7,353,329 B2
(45) Date of Patent: Apr. 1, 2008

(54) MEMORY BUFFER DEVICE INTEGRATING REFRESH LOGIC

(75) Inventors: Robert M. Ellis, Hillsboro, OR (US); Kuljit S. Bains, Olympia, WA (US); Chris B. Freeman, Portland, OR (US); John B. Halbert, Beaverton, OR (US); Narendra S. Khandekar, Folsom, CA (US); Michael W. Williams, Citrus Heights, CA (US)

(73) Assignee: Intel Corporation, Santa Clara, CA (US)

( * ) Notice: Subject to any disclaimer, the term of this patent is extended or adjusted under 35 U.S.C. 154(b) by 318 days.

(21) Appl. No.: 10/674,981

(22) Filed: Sep. 29, 2003

(65) Prior Publication Data

US 2005/0071543 A1     Mar. 31, 2005

(51) Int. Cl.
*G06F 12/16* (2006.01)
(52) U.S. Cl. .................... 711/106; 365/222; 365/228
(58) Field of Classification Search ............... None
See application file for complete search history.

(56) References Cited

U.S. PATENT DOCUMENTS

| 5,689,677 | A | 11/1997 | MacMillan |
| 5,859,809 | A | 1/1999 | Kim |
| 6,400,631 | B1 * | 6/2002 | Williams et al. ............. 365/222 |
| 6,925,086 | B2 * | 8/2005 | Curtis et al. ............. 370/395.7 |
| 2001/0008496 | A1 * | 7/2001 | Leung ........................ 365/223 |

FOREIGN PATENT DOCUMENTS

WO        WO 99/30240        6/1999

OTHER PUBLICATIONS

Notification Of Transmittal Of The International Search Report And The Written Opinion Of The International Searching Authority, Or The Declaration for PCT/US2004/032039, mailed Mar. 16, 2005, 2 pages.

* cited by examiner

*Primary Examiner*—B. James Peikari
(74) *Attorney, Agent, or Firm*—Blakely, Sokoloff, Taylor & Zafman LLP

(57) ABSTRACT

Apparatus and method to carry out refresh operations on rows of memory cells within a memory device independently of a memory controller during times when there is no activity on a memory bus coupling the memory device to the memory controller that involves the memory device.

31 Claims, 6 Drawing Sheets

MEMORY BUFFER DEVICE INTEGRATING REFRESH LOGIC

BACKGROUND

With ever greater demands to be able to store and retrieve data ever more quickly, memory devices, including dynamic random access memory (DRAM) devices, have continued to become ever faster. With the increasing speed of the memory devices has been an accompanying need for increases in the speed of the memory interfaces and memory busses used to communicate addresses, commands and data with these memory devices. Concerns have arisen as to whether or not the current practice of bussing the majority of signals provided by the memory interface of a memory controller to multiple memory devices, such as dual inline memory devices (DIMMs), will continue to be possible as the speed of these signals continue to increase.

Both increasing speed and increasing desires to conserve power have also raised concerns about increasing the efficiency of how memory interfaces and memory busses are used, and have raised the issue of finding ways to decrease the overhead in communicating addresses and/or commands required in the communication of data to and from memory devices. As demands to transfer data ever faster have continued to increase, every use of a memory interface and/or memory bus to transfer an address or command has started to become viewed as a lost opportunity to have used that amount of time and electrical energy to transfer data, instead.

BRIEF DESCRIPTION OF THE DRAWINGS

The objects, features, and advantages of the present invention will be apparent to one skilled in the art in view of the following detailed description in which.

DETAILED DESCRIPTION

In the following description, for purposes of explanation, numerous details are set forth in order to provide a thorough understanding of the present invention. However, it will be apparent to one skilled in the art that these specific details are not required in order to practice the present invention.

Embodiments of the present invention concern incorporating support for the refreshing of memory cells within a memory module, either in place of or in cooperation with the refreshing of memory cells via circuitry within a memory controller. Although the following discussion centers on DRAM devices in which memory cells are organized into multiple two dimensional arrays of rows and columns, it will be understood by those skilled in the art that the invention as hereinafter claimed may be practiced in support of any type of memory device having memory cells organized in any of a number of ways, including interleaved banks, arrays of more than two dimensions (i.e., more than two-part addresses), content-addressable, etc. Also, although at least part of the following discussion centers on memory devices within computer systems, it will be understood by those skilled in the art that the invention as hereinafter claimed may be practiced in connection with other electronic devices having memory devices.

Figure 1:
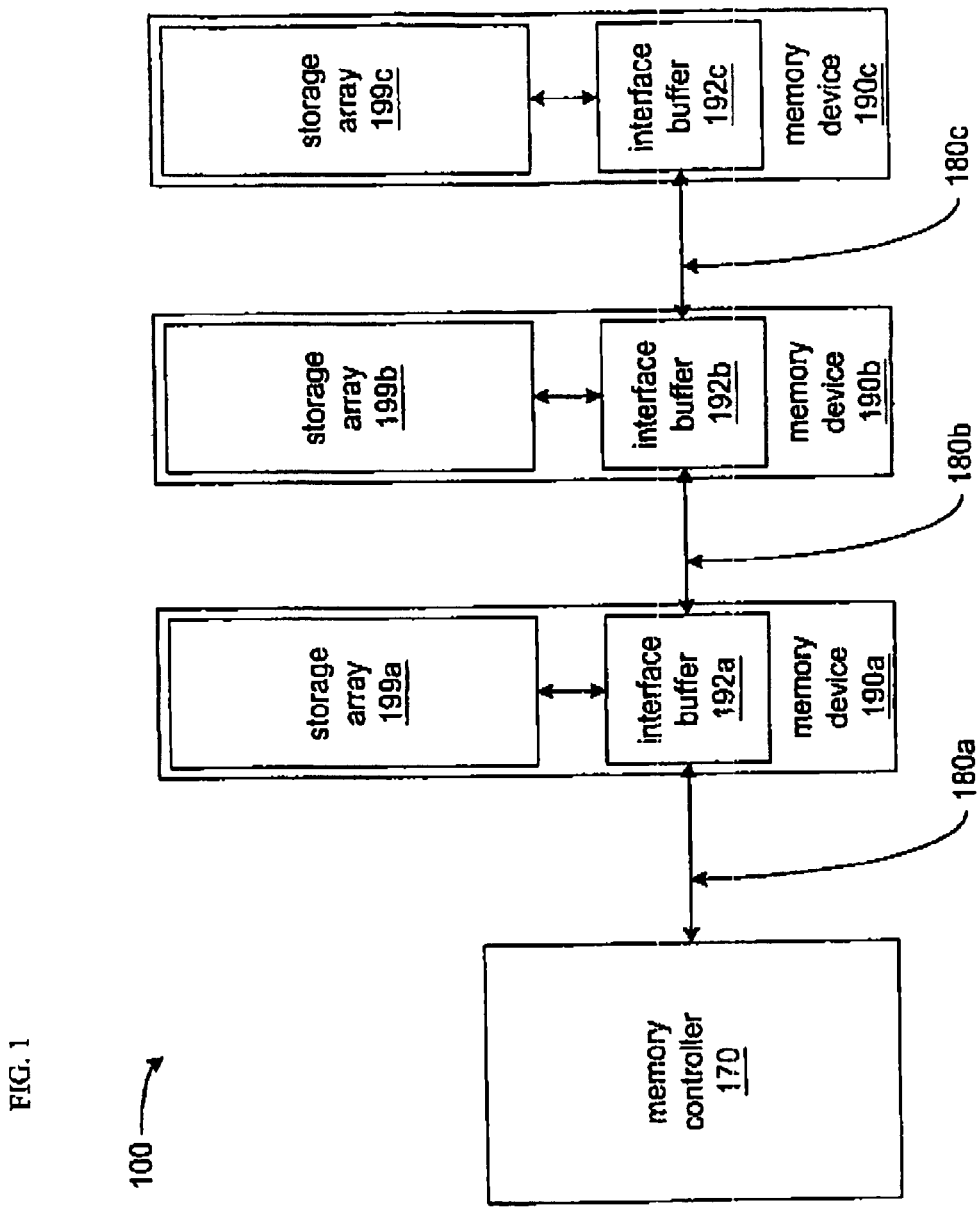
FIG. 1 is a block diagram of an embodiment employing a memory system.

FIG. 1 is a simplified block diagram of one embodiment employing a memory system. Memory system 100 is, at least in part, made up of memory controller 170 and memory devices 190*a-c* coupled together via memory busses 180*a-c* in a series of point-to-point connections. Those skilled in the art of the design of memory systems will readily recognize that FIG. 1 depicts but one form of a relatively simple memory system, and that alternate embodiments are possible in which the exact arrangement and configuration of components may be reduced, augmented or otherwise altered without departing from the spirit and scope of the present invention as hereinafter claimed. For example, although memory system 100 is depicted as having three memory devices 190*a-c* coupled through a single chain of point-to-point connections to just one memory interface provided by memory controller 170, it will be readily understood by those skilled in the art that other possible embodiments of memory system 100 may be made up of multiple parallel chains of point-to-point connections coupling differing numbers of memory devices.

Memory controller 170 controls the functions carried out by memory devices 190*a-c* as part of providing access to memory devices 190*a-c* to external devices (not shown) that are separately coupled to memory controller 170. Specifically, an external device coupled to memory controller 170 issues commands to memory controller 170 to store data within one or more of memory devices 190*a-c*, and to retrieve stored data from one or more of memory devices 190*a-c*. Memory controller 170 receives these commands and relays them to memory devices 190*a-c* in a format having timing and protocols compatible with memory bus 180*a*. In effect, memory controller 170 coordinates accesses made to memory cells within memory devices 190*a-c* in answer to read and write commands from external devices. In support of these functions in various embodiments, memory controller 170 may also coordinate various maintenance operations that must be performed on memory cells within memory devices 190*a-c* to ensure that data stored within memory devices 190*a-c* is preserved. Such maintenance operations may include the initiation of regular refresh operations, particularly if memory devices 190*a-c* are at least partially based on DRAM storage technology.

Each of memory busses 180*a-c* provide a point-to-point connection, i.e., a bus wherein at least the majority of the signals making up that bus connect between only two devices. Limiting the connection of the majority of signals to only two devices aids in maintaining the integrity and desirable electrical characteristics of that majority of signals, and thereby more easily supports the reliable transfer of high speed signals. Memory controller 170 is coupled to memory device 190*a* via memory bus 180*a*, forming a point-to-point connection between memory controller 170 and memory device 190*a*. In turn, memory device 190*a* is likewise further coupled to memory device 190*b* via memory bus 180*b*, and memory device 190*b* is further coupled to memory device 190*c* via memory bus 180*c*. Addresses, commands and data transfer between memory controller 170 and memory device 190*a*, directly, through memory bus 180*a*, while addresses, commands and data must transfer between memory controller 170 and memory devices 190*b* and 190*c* through intervening memory devices and memory busses.

Memory busses 180*a-c* may be made up of various separate address, control and/or data signal lines to communicate addresses, commands and/or data, either on separate conductors or on shared conductors in different phases occurring in sequence over time in a multiplexed manner. Alternatively, or perhaps in conjunction with such separate signal lines, addresses, commands and/or data may be encoded for transfer in various ways and/or may be transferred in packets. As those skilled in the art will readily recognize, many forms of timing, signaling and protocols may be used in communications across a point-to-point bus between two devices. Furthermore, the exact quantity and characteristics of the various signal lines making up various possible embodiments of memory busses 180*a-c* may be configured to be interoperable with any of a number of possible memory interfaces, including widely used current day interfaces or new interfaces currently in development. In embodiments where activity on various signal lines is meant to be coordinated with a clock signal (as in the case of a synchronous memory bus), one or more of the signal lines, perhaps among the control signal lines, serves to transmit a clock signal across each of memory busses 180*a-c*.

Each of memory devices 190*a-c* are made up of one each of interface buffers 192*a-c* and storage arrays 199*a-c*, respectively, with corresponding ones of interface buffers 192*a-c* and storage arrays 199*a-c* being coupled together within each of memory devices 190*a-c*. Storage arrays 199*a-c* are each made up of an array of memory cells in which the actual storage of data occurs. In some embodiments, storage arrays 199*a-c* may each be made up of a single integrated circuit, (perhaps even a single integrated circuit that also incorporates corresponding ones of interface buffers 192*a-c*), while in other embodiments, storage arrays 199*a-c* may each be made up of multiple integrated circuits. In various possible embodiments, interface buffers 192*a-c* are made up of one or more integrated circuits separate from the one or more integrated circuits making up storage arrays 199*a-c*, respectively. Also, in various possible embodiments, each of memory devices 190*a-c* may be implemented in the form of a SIMM (single inline memory module), SIPP (single inline pin package), DIMM (dual inline memory module), or any of a variety of other forms as those skilled in the art will recognize.

Interface buffers 192*a-c* provide an interface between corresponding ones of storage arrays 199*a-c* and one or more of memory busses 180*a-c* to direct transfers of addresses, commands and data between each of storage arrays 199*a-c* and memory controller 170. In the case of memory device 190*a*, interface buffer 192*a* directs transfers of addresses, commands and/or data intended to be between memory controller 170 and memory device 190*a* to storage array 199*a*, while allowing transfers of addresses, commands and/or data intended to be between memory controller 170 and other memory devices (such as memory devices 190*b* and 190*c*) to pass through interface 192*a*. In some embodiments of memory devices 190*a-c*, especially where storage arrays 199*a-c* are made up of multiple integrated circuits, interface buffers 192*a-c* may be meant to provide an interface to storage arrays 199*a-c* that are meant to be compatible with widely used types of memory devices, among them being DRAM (dynamic random access memory) devices such as FPM (fast page mode) memory devices, EDO (extended data out), dual-port VRAM (video random access memory), window RAM, SDR (single data rate), DDR (double data rate), RAMBUS™ DRAM, etc.

Figure 2:
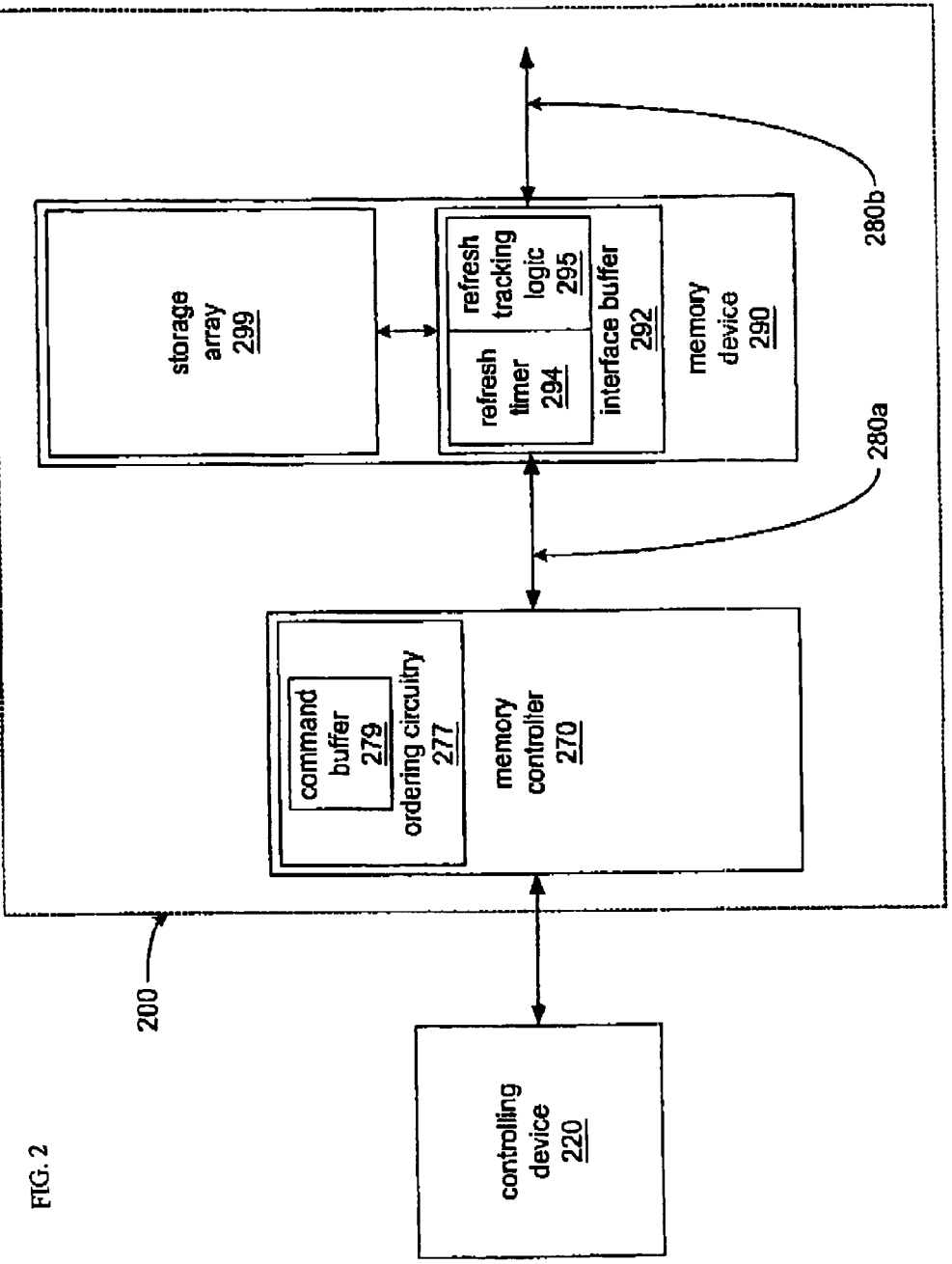
FIG. 2 is another block diagram of an embodiment employing a memory system.

FIG. 2 is another block diagram of an embodiment employing a memory system. Memory system 200 is, at least in part, made up of memory controller 270 and memory device 290 coupled together via memory bus 280*a* in a point-to-point connection. Although FIG. 2 depicts the connection of only one memory device (namely memory device 290) to memory controller 270, this is but one example of a configuration of a memory system depicted for sake of simplicity of discussion, and as hinted in FIG. 2, interface buffer 292 of memory device 290 may provide the ability to form a point-to-point connection with another device via memory bus 280*b*.

Memory controller 270 controls the functions carried out by memory device 290 as part of providing another device, such as controlling device 220 which is coupled to memory controller 270, with access to memory device 290. Specifically, controlling device 220 issues commands to memory controller 270 to store data within and retrieve data from memory device 290. In turn, memory controller 270 coordinates accesses made to memory cells within memory device 290 to store and retrieve data in answer to read and write commands from controlling device 220. In some embodiments, memory controller 270 may incorporate ordering circuitry 277 having command buffer 279 to store and make possible the reordering of data storage and retrieval commands received from controlling device 220 to create sequence of read and write commands ordered to be more efficient given various possible characteristics of memory bus 280*a* and/or memory device 290.

Memory device 290 provides a number of memory cells to store data that may be provided and/or required by controlling device 220, with those memory cells being organized into an array within storage array 299. Interface buffer 292 within memory device 290 receives read and write commands across memory bus 280*a*, and accesses appropriate memory cells within storage array 299 to either store or retrieve data as commanded. In support of storing and retrieving data, various maintenance operations must be performed on the memory cells within storage array 299 to ensure that data stored within those memory cells is preserved, and such maintenance operations may include regular refresh operations, particularly if storage array 299 is at least partially based on DRAM storage technology. To carry out such refresh operations, interface buffer 292 incorporates logic to initiate refresh operations at intervals frequent enough prevent loss of stored data. Such logic to initiate refresh operations may include refresh timer 294 to provide a timing basis for intervals on which refresh operations are to occur, and/or refreshing tracking logic 295 to determine the row address of the next row of memory cells within storage array 299 to be refreshed in embodiments where at least a portion of the memory cells within storage array 299 are organized into a two-dimensional array of rows and columns.

In some embodiments, logic within interface buffer 292 to initiate refresh operations may be designed and/or programmed to carry out refresh operations in an opportunistic manner in which "dead time" between read and/or write accesses to storage array 299 is used to carry out refresh operations. This opportunistic approach may be deemed desirable to try to avoid delaying the carrying out of a read or write operation. In some variations logic within interface buffer 292 may rely on the occurrence of a minimum period of time of inactivity and/or other patterns of behavior occurring on memory bus 280*a* as an indicator of when a dead time is occurring or is about to occur. Such logic within interface buffer 292 may be designed and/or programmed to interpret times when memory controller 270 may have powered down memory bus 280a as an opportunity to carry out refresh operations.

In other embodiments, logic within memory controller 270 may be designed and/or programmed to provide interface buffer 292 with an indication of either upcoming dead time and/or an indication of the onset of dead time. This may be deemed desirable to allow better coordination of the transfer of addresses, commands and/or data initiated by memory controller 270 and refresh operations carried out by interface buffer 292. In variations where memory controller 270 makes use of ordering circuitry 277 and/or command buffer 279 to more efficiently organize commands to be carried out, memory controller 270 may be able to provide an indication to interface buffer 292 of the length of time of either upcoming or currently occurring dead time.

Regardless of the mechanism used to identify, select or indicate an opportunity to initiate a refresh operation, interface buffer 292 may be designed and/or programmed to require that read and/or write operations be delayed or prevented to accommodate occurrences of refresh operations. This may occur where a refresh operation has either already begun or where sufficient time has passed without the initiation of a refresh operation that one or more refresh operations must be carried out, and interface buffer 292 may be designed and/or programmed to indicate to memory controller 270 that a given read and/or write operation cannot be carried out at a given moment. This indication may be provided with a status signal across memory bus 280a providing specific indication to memory controller 270 that a refresh operation is in progress, perhaps to actively prevent memory controller 270 from transmitting a read and/or write operation command involving storage array 299 at that time. Alternatively, this indication may take the form of "busy" indication provided by interface buffer 292 in response to an attempted transmission of a read or write command involving storage array 299 by memory controller 270. Such a busy indication may be in the form of a bus retry signal to memory controller 270 that the transmission of the read or write command across memory bus 280a will have to be attempted again as a way of stalling acceptance of the read or write command to provide additional time for a refresh operation to be carried out or completed.

Regardless of the mechanism used to delay or prevent the carrying out of a read and/or write command involving storage array 299 in favor of a refresh operation, memory controller 270, in some embodiments, may be designed and/or programmed to carry out read and/or write operations involving other storage arrays, perhaps within another memory device through memory bus 280b. Alternatively, in other embodiments, memory controller 270 may respond to the delaying or prevention of a given read and/or write operation by powering down memory bus 280a until some later time where it may be possible to carry out the given read and/or write operation.

Figure 3:
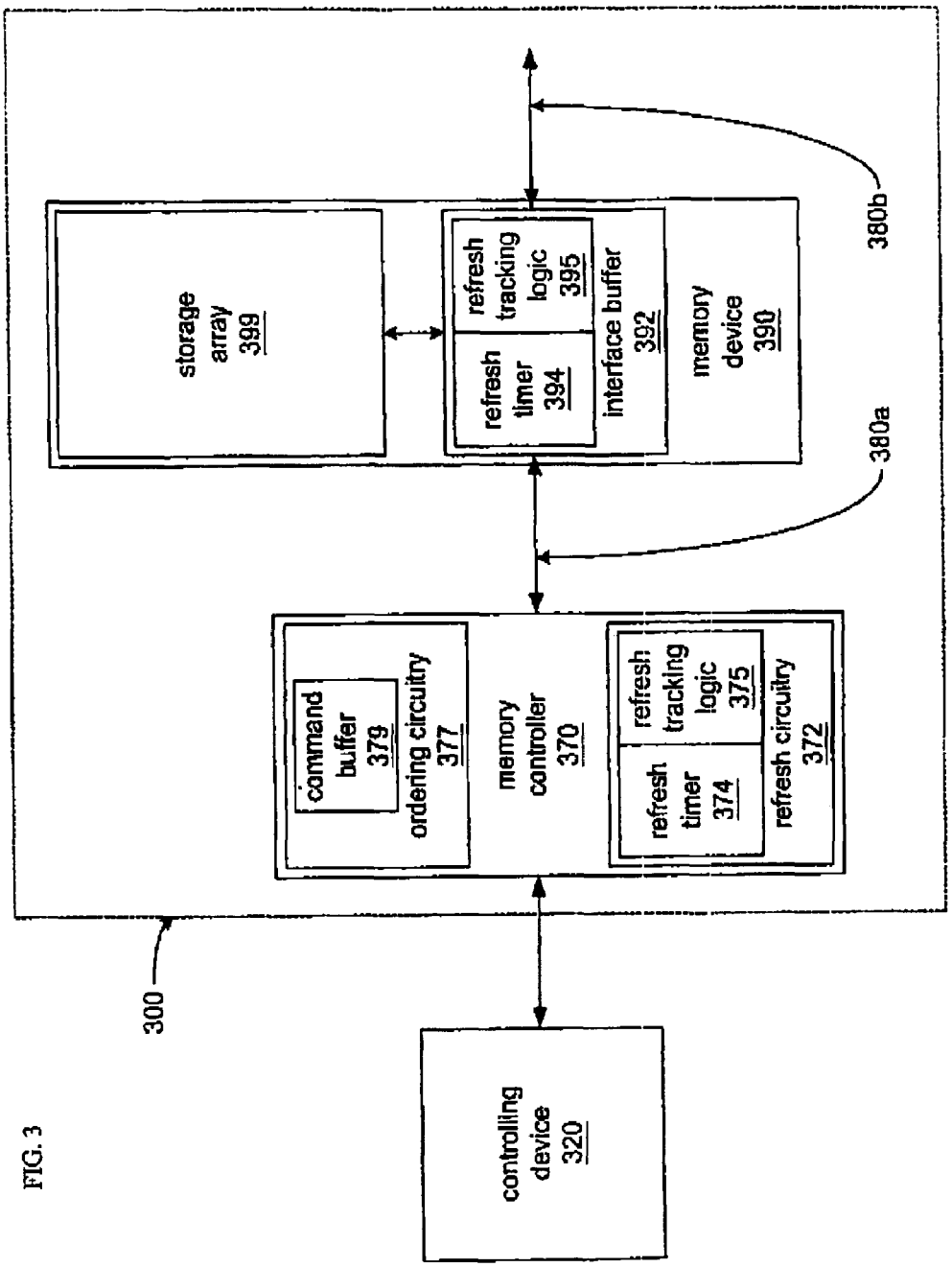
FIG. 3 is still another block diagram of an embodiment employing a memory system.

FIG. 3 is still another block diagram of an embodiment employing a memory system. In a manner not unlike memory system 200 of FIG. 2, memory system 300 is, at least in part, made up of memory controller 370 and memory device 390 coupled together via memory bus 380a in a point-to-point connection. Although FIG. 3 depicts the connection of only one memory device (namely memory device 390) to memory controller 370, this is but one example of a configuration of a memory system depicted for sake of simplicity of discussion, and as hinted in FIG. 3, interface buffer 392 of memory device 390 may provide the ability to form a point-to-point connection with another device via memory bus 380b.

Memory controller 370 controls the functions carried out by memory device 390 as part of providing another device, such as controlling device 320 which is coupled to memory controller 370, with access to memory device 390. Specifically, memory controller 370 coordinates accesses made to memory cells within memory device 390 to store and retrieve data in answer to read and write commands from controlling device 320. In various possible embodiments, memory controller 370 may incorporate refresh circuitry having refresh timer 374 and/or refresh tracking logic 375 to initiate and/or coordinate the refreshing of memory cells within one or more memory devices coupled to memory controller 370, such as memory device 390. Also, in various possible embodiments, memory controller 370 may incorporate ordering circuitry 377 having command buffer 379 to store and make possible the reordering of data storage and retrieval commands received from controlling device 320 to create sequence of read and write commands ordered to be more efficient given various possible characteristics of memory bus 380a and/or memory device 390.

Memory device 390 provides a number of memory cells within storage array 399 to store data that may be provided and/or required by controlling device 320. Interface buffer 392 within memory device 290 receives read and write commands across memory bus 380a, and accesses appropriate memory cells within storage array 399 to either store or retrieve data as commanded. In support of carrying out refresh operations on memory cells within storage array 399, interface buffer 392 incorporates logic to initiate refresh operations, such as refresh timer 394 and/or refreshing tracking logic 395.

In some embodiments, the task of controlling refresh operations on memory cells within storage array 399 may be distributed between refresh circuitry 372 and interface buffer 392. At various times, it may be deemed desirable for refresh circuitry 372 to control refresh operations, while at other times, it may be deemed desirable for interface buffer 392 within memory device 390 (as well as corresponding interface buffers within other memory devices that may also be present) to control refresh operations in a manner that may be more or less independent of any control by refresh circuit 372.

At various times in various embodiments, refresh circuitry 372 may control refresh operations. This may be done to take advantage of information available from ordering circuitry 377 within memory controller 370 as to the nature of currently executing and upcoming commands that may be stored in command buffer 379 so as to allow refresh circuitry 372 to coordinate the times at which refresh operations are caused to take place to minimize occasions in which read/write instructions may be delayed by the carrying out of refresh operations. Furthermore, in possible embodiments of memory system 300 where more than one memory device (such as memory device 390) is present, refresh circuitry 372 may coordinate refresh operations in multiple memory devices such that while a read/write operation is being carried out on one memory device, one or more other memory devices are caused to engage in refresh operations.

At other times in various embodiments, interface buffer 392 may control refresh operations within memory device 390, possibly during times when memory controller 370 has powered down memory bus 380a (and possibly memory bus 380b, as well) in an effort to reduce the overall power consumed by memory system 300. This may be a frequent occurrence in embodiments where clock speed and/or signaling characteristics of memory bus 380a are such that a considerable amount of power is usually consumed regardless of whether any transfers of addresses, commands and/or data is occurring on memory bus 380a. It may well be the case that placing the memory cells within storage array 399 into a lower power state is not as desirable as powering down memory bus 380a as a result of the memory cells within storage array 399 requiring more time to undergo the process of entering and/or exiting a lower power state than for memory bus 380a to be powered up and/or powered down.

It may be in many possible embodiments that control over refresh operations is frequently handed back and forth between refresh circuitry 372 and interface buffer 392 on a moment-by-moment demand-driven basis that depends on the nature and/or level of activity occurring memory bus 380a. At times when a great many transfers are occurring across memory bus 380a, it may be deemed most desirable for refresh circuitry 372 to control refresh operations to improve coordination of read/write and refresh operations to achieve more efficient utilization of storage array 399. Alternatively, it may be deemed most desirable for interface buffer 392 to control refresh operations to increase the availability of memory bus 380a for use in more transfers of addresses, data and/or commands other than refresh commands. At other times when fewer transfers are occurring across memory bus 380a, it may again be deemed most desirable for interface buffer 392 to control refresh operations to allow memory bus 380a to be powered down for short periods of time between what few transfers may be occurring, while the memory cells within storage array 399 are allowed to remain fully active to be ready to respond to the next read/write command.

In embodiments in which interface 392 and storage array 399 are incorporated within separate integrated circuits, and especially in embodiments where storage array 399 is made up of multiple integrated circuits, each of the integrated circuits making up storage array 399 may incorporate individual self-refresh logic circuitry to be used at times when memory system 300 is to powered down to a lower power state in which no read/write operations are to occur, but in which data must still be preserved within the memory cells.

Referring to both FIGS. 2 and 3, in embodiments in which more than one memory device is incorporated into a memory system, the provision of the interface buffer within each memory device incorporating logic to carry out refresh operations may be used to enable parallel independent execution of refresh operations within multiple memory devices. In effect, efficiencies in the utilization of the memory cells within each storage array and/or the bandwidth available on each memory bus could be greatly increased by the removal of the overhead of having refresh circuitry within a memory controller centrally control and coordinate refresh operations across multiple busses and/or multiple memory devices.

Figure 4:
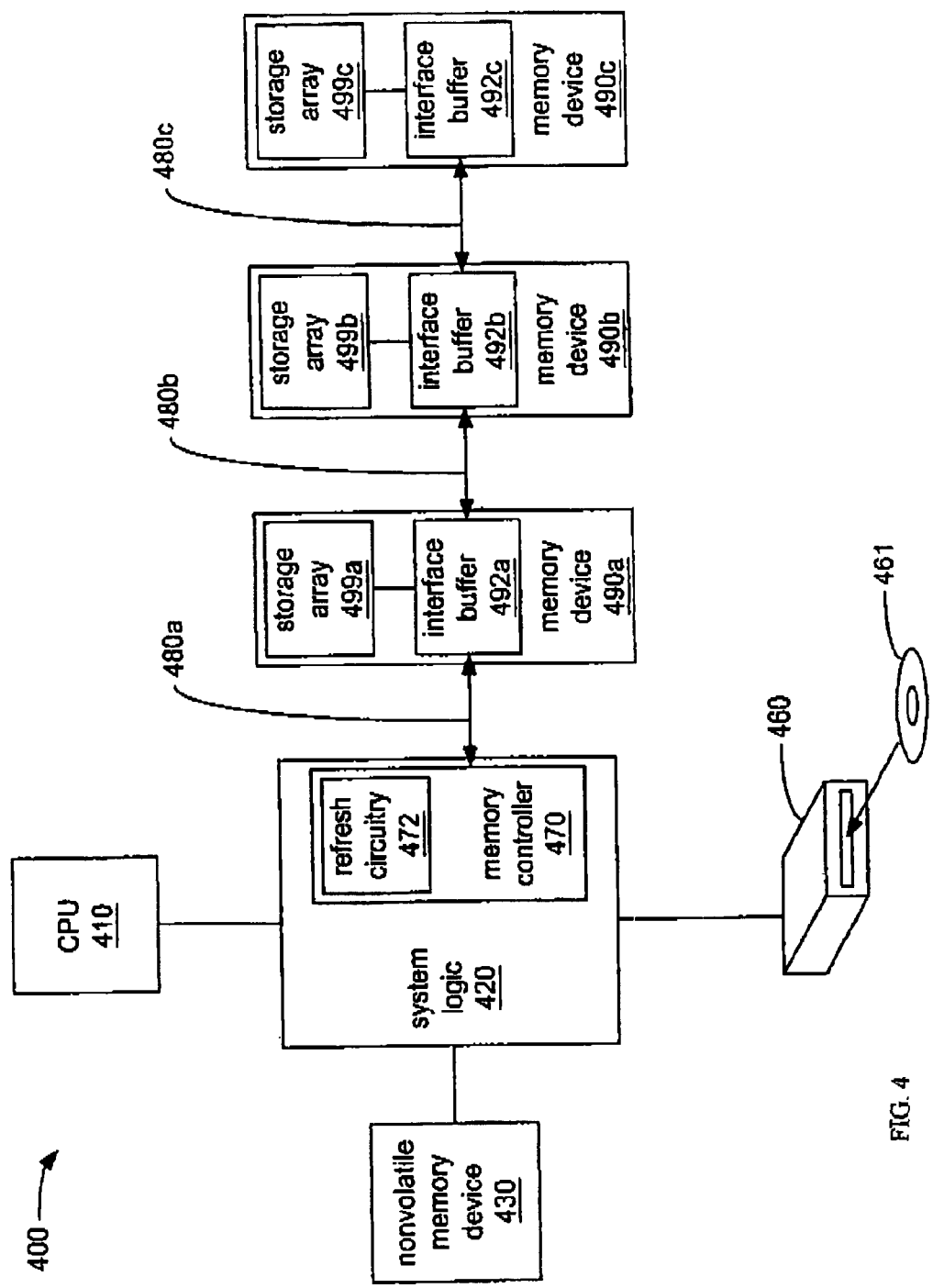
FIG. 4 is a block diagram of an embodiment employing a computer system.

FIG. 4 is a simplified block diagram of an embodiment employing a computer system. Computer system 400 is, at least in part, made up of processor 410, system logic 420, and memory devices 490a-c. System logic 420 is coupled to processor 410 and performs various functions in support of processor 410 including providing processor 410 with access to memory devices 490a-c to which system logic 420 is also coupled, using memory controller 470 within system logic 420. Processor 410, system logic 420 and memory devices 490a-c make up a form of core for computer system 400 that is capable of supporting execution of machine readable instructions by processor 410 and the storage of data and instructions within memory devices 490a-c.

In various embodiments, processor 410 could be any of a variety of types of processor including a processor capable of executing at least a portion of the widely known and used "x86" instruction set, and in other various embodiments, there could be more than one processor. In various embodiments, memory devices 490a-c could be any of a variety of types of dynamic random access memory (RAM) including fast page mode (FPM), extended data out (EDO), single data rate (SDR) or double data rate (DDR) forms of synchronous dynamic RAM (SDRAM), RAM of various technologies employing a RAMBUS™ interface, etc., and memory controller 470 provides logic 420 with an appropriate interface for the type of memory being used. At least a portion of the memory cells of memory devices 490a-c are organized into rows and columns in a two dimensional array. As those skilled in the art will recognize, the depiction of three memory devices 490a-c is but an example of a memory system that could be a part of a computer system or other electronic system, and that a differing number of memory devices could be used without departing from the spirit and scope of the present invention as hereinafter claimed.

In some embodiments, system logic 420 is coupled to and provides processor 410 with access to storage device 460 by which data and/or instructions carried by storage media 461 may be accessed. Storage media 461 may be of any of a wide variety of types and technologies as those skilled in the art will understand, including CD or DVD ROM, magnetic or optical diskette, magneto-optical disk, tape, semiconductor memory, characters or perforations on paper or other material, etc. In some embodiments, nonvolatile memory device 430 is coupled to system logic 420 (or other part of computer system 400) and provides storage for an initial series of instructions executed at a time when computer system 400 is either "reset" or initialized (for example, when computer system 400 is "turned on" or "powered up") to perform tasks needed to prepare computer system 400 for normal use. In some variations of such embodiments, upon initialization or resetting of computer system 400, processor 410 accesses nonvolatile memory device 430 to retrieve instructions to be executed to prepare memory controller 470 for normal use in providing access for processor 410 to memory devices 490a-c. It may be that these same retrieved instructions are executed to prepare system logic 420 for normal use in providing access to storage device 460 and whatever form of storage media 461 that may be used by storage device 460.

In some embodiments, storage media 461 carries machine-accessible instructions to be executed by processor 410 to cause processor 410 to carry out one or more tests of memory device 490a-c to determine what functions memory devices 490a-c may support. If it is determined that one or more of memory devices 490a-c are equipped with interface buffers (such as interface buffers 492a-c) that are capable of carrying out refresh operations on memory cells within one or more of storage arrays 499a-c, as described above, then processor 410 may be caused to program or otherwise configure memory controller 470 and/or one or more of memory devices 490a-c to make use of such refresh capabilities. In some variations, processor 410 may be caused to program the timing intervals and/or other parameters for refresh operations within one or more of memory devices 490a-c. In some variations where memory controller 470 incorporates refresh circuitry 472, processor 410 may be caused to program memory controller 470 to carry out refresh operations under some circumstances while relinquishing control of refresh operations to one or more of interface buffers 492a-c under other circumstances. Processor 410 may be further caused to program and/or configure both memory controller 470 and one or more of interface buffers 492a-c to support the transfer of control of refresh operations from memory controller 470 to one or more of interface buffers 492a-c at times when processor 410 is caused to power down one or more of memory busses 480a-c forming a chain of point-to-point connections among memory controller 470 and memory devices 490a-c. Alternatively, processor 410 may be caused to program memory controller 470 such that refresh circuitry 472 is disabled or at least largely unused for the purpose of carrying out refresh operations, while also programming each of interface buffers 492a-c to carry out refresh operations.

Figure 5:
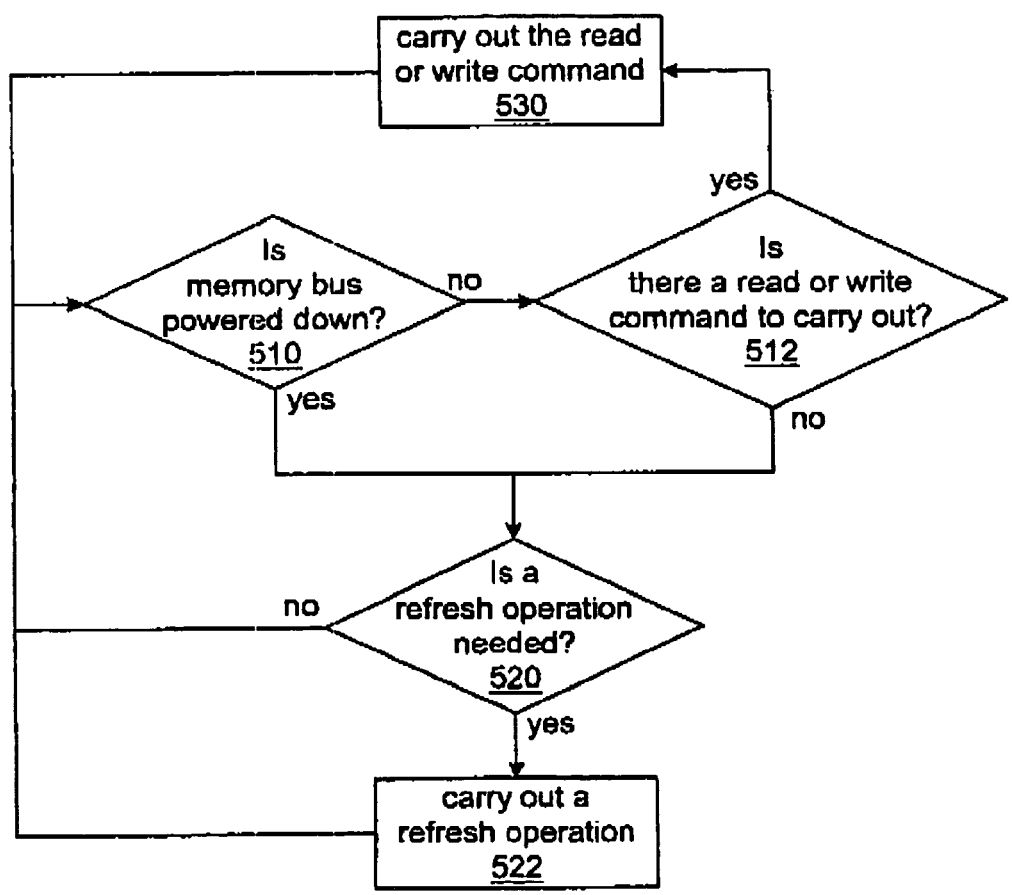
FIG. 5 is a flow chart of an embodiment.

FIG. 5 is a flow chart of possible embodiments. At 510, a check is made by circuitry within a memory device of whether or not a memory bus coupling the memory device to another device from which read, write and/or refresh commands are received has been powered down. If such a memory bus has been powered down, then the powering down of a memory bus may be taken as an indication of the occurrence of dead time providing an opportunity to carry out one or more refresh operations, and at 520 a check is made of whether or not a refresh operation needs to be carried out to preserve data stored within memory cells of the memory device. If such a memory bus has not been powered down, then a check is made at 512 as to whether or not there is a read or write command to carry out. If there is no read or write command pending, then the lack of a read or write operation to be carried out may be taken as an indication of the occurrence of dead time, and at 520 a check is made of whether or not a refresh operation needs to be carried out. If there is a read or write command to be carried out, then that read or write command is carried out at 530 before the status of the memory bus is again check at 510.

The determination at 520 of whether or not a refresh operation is needed or not may be based on the amount of time that has passed since previous refresh operations, and/or may be affected by a desire to avoid unnecessary consumption of power by carrying out refresh operations more frequently than is known to be necessary. If a refresh operation is not deemed to be necessary, then the status of the memory bus is again checked at 510. However, if a refresh operation is deemed to be necessary, then a refresh operation is carried out at 522, before the status of the memory bus is again checked at 510.

Figure 6:
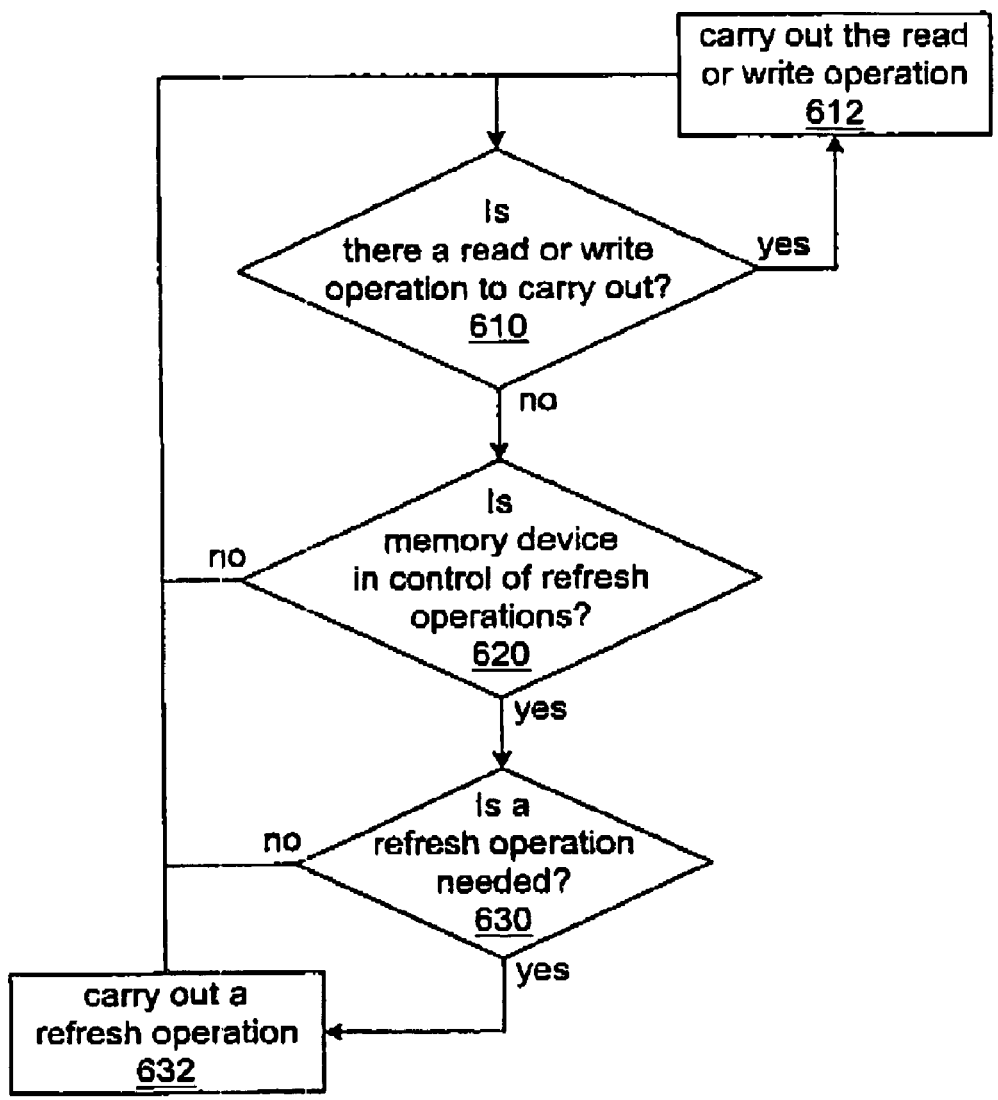
FIG. 6 is another flow chart of an embodiment.

FIG. 6 is another flow chart of possible embodiments. At 610, a check is made by circuitry within a memory device of whether or not there is a read or write operation to be carried out. If there is a read or write operation to be carried out, then the carrying out of that operation occurs at 612, and another check for a read or write operation to be carried out is again made at 610. If there is no read or write operation to be carried out, then at 620 a check is made as to whether the circuitry within the memory device has control of refresh operations, as opposed to another device coupled to the memory device having control of refresh operations, such other device perhaps being a memory controller. If the circuitry within the memory device does not have control of refresh operations then a check is once again made at 610 for read or write operations to carry out. If the circuitry within the memory device does have control of refresh operations, then a check is made at 630 to determine whether or not a refresh operation is needed maintain data stored within memory cells within the memory device.

In a manner similar to what was described with regard to FIG. 5, the determination at 630 of whether or not a refresh operation is needed or not may be based on the amount of time that has passed since previous refresh operations, and/or may be affected by a desire to avoid unnecessary consumption of power by carrying out refresh operations more frequently than is known to be necessary. If a refresh operation is not deemed to be necessary, then the existence of a read or write operation to be carried out is again checked at 610. However, if a refresh operation is deemed to be necessary, then a refresh operation is carried out at 632, before the status existence of read or write operations to be carried out occurs at 632.

The invention has been described in some detail with regard to various possible embodiments. It is evident that numerous alternatives, modifications, variations and uses will be apparent to those skilled in the art in light of the foregoing description. It will be understood by those skilled in the art that the present invention may be practiced in support of many possible types of memory devices employing any of a number of possible memory technologies. It will also be understood by those skilled in the art that the present invention may be practiced in support of electronic devices other than computer systems such as audio/video entertainment devices, controller devices in vehicles, appliances controlled by electronic circuitry, etc.

What is claimed is:

1. A memory device comprising:
a storage array comprised of a plurality of memory cells organized into an array of rows;
an interface buffer coupled to the storage array, and having a first interface to couple the memory device to a first memory bus to couple the memory device to an external memory controller; and
refresh logic associated with the interface buffer to carry and a refresh operation on a row within the storage array during a period of time in which there are no transactions carried out by the external memory controller on the first memory bus that involve the storage array, the refresh logic to detect a pattern of activity on the first memory bus to identify a time to carry out the refresh operations and to determine which device of a plurality of devices will control the refresh operation.

2. The memory device of claim 1, wherein the refresh logic is a component of the interface buffer, and wherein the memory device is comprised of a circuitboard to which is attached at least one integrated circuit that comprises the storage array and at least one integrated circuit that comprises the interface buffer.

3. The memory device of claim 1, wherein the first memory bus provides a point-to-point connection between the memory device and the external memory controller, the interface buffer has a second interface to couple the memory device to a second memory bus to provide a point-to-point connection between the memory device and another memory device, and the interface buffer passes through bus activity between the first and second memory busses that does not involve the storage array.

4. The memory device of claim 3, wherein both a transfer of data between the external memory controller and the first interface of the interface buffer and a transfer of data between the second interface of the interface buffer and the other memory device occur with data transmitted in a packets.

5. The memory device of claim 3, wherein the refresh logic monitors activity on the first memory bus to identify a dead time in which no commands are received from the first memory bus involving the storage array, providing an opportunity for the refresh logic to opportunistically carry out a refresh operation on a row within the storage array without delaying the carrying out of an access command involving the storage array.

6. The memory device of claim 5, wherein the refresh logic carries out a refresh operation on a row within the storage array during a period of time in which a transaction between the external memory controller and the other memory device occurs.

7. The memory device of claim 3, wherein the refresh logic awaits a signal from the external memory controller to identify a dead time in which no commands involving the storage array will be transmitted by the external memory controller, providing an opportunity for the refresh logic to carry out a refresh operation on a row within the storage array without delaying the carrying out of an access command involving the storage array.

8. The memory device of claim 3, wherein the refresh logic monitors the first memory bus for the occurrence of a powering down of the first memory bus, providing an opportunity for the refresh logic to opportunistically carry out a refresh operation on a row within the storage array without delaying the carrying out of an access command involving the storage array.

9. An interface buffer comprising:
a local interface to a storage array comprised of a plurality of memory cells organized into an array of rows;
a first interface to couple the storage array to a first memory bus to couple the storage array to an external memory controller wherein the first memory bus provides a point-to-point connection between the first interface and the external memory controller;
a second interface to couple the storage array to a second memory bus to couple the second interface to another interface buffer to couple another storage array to the external memory controller through the interface buffer wherein the second memory bus provides a point-to-point connection between the second interface and the other interface buffer; and
refresh logic to carry out a refresh operation on a row within the storage array during a period of time in which there are no transactions carried out by the external memory controller on the first memory bus that involve the storage array, the refresh logic to detect a pattern of activity on the first memory bus to identify a time to carry out the refresh operations and to determine which device of a plurality of devices will control the refresh operation.

10. The interface buffer of claim 9, wherein the interface buffer is comprised of at least one integrated circuit, the storage array is comprised of at least one integrated circuit, and both the at least one integrated circuit comprising the interface buffer and the at least one integrated circuit comprising the storage array are attached to a circuitboard to comprise a memory device.

11. The interface buffer of claim 10, wherein the first interface is coupled to the first memory bus and the second interface is coupled to the second memory bus when the memory device is coupled to another circuitboard to which the external memory controller is attached.

12. The interface buffer of claim 9, wherein both a transfer of data between the external memory controller and the first interface and a transfer of data between the second interface and the other interface buffer occur with data transmitted in a packet.

13. The memory device of claim 9, wherein the refresh logic monitors activity on the first memory bus to identify a dead time in which no commands are received from the first memory bus involving the storage array, providing an opportunity for the refresh logic to opportunistically carry out a refresh operation on a row within the storage array without delaying the carrying out of an access command involving the storage array.

14. The memory device of claim 13, wherein the refresh logic carries out a refresh operation on a row within the storage array during a period of time in which a transaction between the external memory controller and the other storage array occurs.

15. The memory device of claim 9, wherein the refresh logic awaits a signal from the external memory controller to identify a dead time in which no commands involving the storage array will be transmitted by the external memory controller, providing an opportunity for the refresh logic to carry out a refresh operation on a row within the storage array without delaying the carrying out of an access command involving the storage array.

16. The memory device of claim 9, wherein the refresh logic monitors the first memory bus for the occurrence of a powering down of the first memory bus, providing an opportunity for the refresh logic to opportunistically carry out a refresh operation on a row within the storage array without delaying the carrying out of an access command involving the storage array.

17. A memory system comprising:
a memory controller;
a first memory bus coupled to the memory controller;
a first memory device having a first storage array comprised of a plurality of memory cells organized into rows and a first interface buffer coupled within the first memory device to the first storage array, wherein the first interface buffer provides a first interface by which the first memory device is coupled to the first memory bus forming a point-to-point connection between the memory controller and the first interface, a second interface, and a first refresh logic to carry out a refresh operation on a row within the first storage array during a period of time in which there are no transactions carried out by the memory controller on the first memory bus that involve the first storage array, the refresh logic to detect a pattern of activity on the first memory bus to identify a time to carry out the refresh operations and to determine which device of a plurality of devices will control the refresh operation;
a second memory bus coupled to the second interface; and
a second memory device having a second storage array comprised of a plurality of memory cells organized into rows and a second interface buffer coupled within the second memory device to the second storage array, wherein the second interface buffer provides a third interface by which the second memory device is coupled to the second memory bus forming a point-to-point connection between the third interface and the second interface, and a second refresh logic to carry out a refresh operation on a row within the second storage array during a period of time in which there are no transactions carried out by the memory controller on the second memory bus that involve the second storage array.

18. The memory system of claim 17, wherein the first interface buffer passes through bus activity between the first and second memory busses that does not involve the first storage array.

19. The memory system of claim 18, wherein both a transfer of data between the memory controller and the first interface and a transfer of data between the second interface and the third interface occur with data transmitted in a packet.

20. The memory system of claim 17, wherein the first refresh logic monitors activity on the first memory bus to identify a dead time in which no commands are received from the first memory bus involving the first storage array, providing an opportunity for the first refresh logic to opportunistically carry out a refresh operation on a row within the first storage array without delaying the carrying out of an access command involving the first storage array.

21. The memory system of claim 20, wherein the first refresh logic carries out a refresh operation on a row within the first storage array during a period of time in which a transaction between the memory controller and the second storage array occurs.

22. The memory system of claim 17, wherein the second refresh logic monitors the second memory bus for the occurrence of a powering down of the second memory bus, providing an opportunity for the refresh logic to opportunistically carry out a refresh operation on a row within the second storage array without delaying the carrying out of an access command involving the second storage array.

23. The memory system of claim 17, wherein the first refresh logic awaits a signal from the external memory controller to identify a dead time in which no commands involving the first storage array will be transmitted by the memory controller, providing an opportunity for the first refresh logic to carry out a refresh operation on a row within the first storage array without delaying the carrying out of an access command involving the first storage array.

24. The memory system of claim 23, wherein the second refresh logic awaits a signal from the external memory controller to identify a dead time in which no commands involving the second storage array will be transmitted by the memory controller, providing an opportunity for the second refresh logic to carry out a refresh operation on a row within the second storage array in parallel with the second refresh logic carrying out a refresh operation on a row within the first storage array without delaying the carrying out of an access command involving the second storage array.

25. The memory system of claim 17, wherein the first refresh logic monitors the first memory bus for the occurrence of a powering down of the first memory bus, providing an opportunity for the first refresh logic to opportunistically carry out a refresh operation on a row within the first storage array without delaying the carrying out of an access command involving the first storage array.

26. The memory system of claim 25, wherein the first refresh logic monitors the second memory bus for the occurrence of a powering down of the second memory bus, providing an opportunity for the second refresh logic to opportunistically carry out a refresh operation on a row within the second storage array in parallel with the second refresh logic carrying out a refresh operation on a row within the second storage array without delaying the carrying out of an access command involving the second storage array.

27. A computer system comprising:
a processor;
a disk storage device coupled to the processor
a memory controller coupled to the processor;
a first memory bus coupled to the memory controller;
a first memory device having a first storage array comprised of a plurality of memory cells organized into rows and a first interface buffer coupled within the first memory device to the first storage array, wherein the first interface buffer provides a first interface by which the first memory device is coupled to the first memory bus forming a point-to-point connection between the memory controller and the first interface, a second interface, and a first refresh logic to carry out a refresh operation on a row within the first storage array during a period of time in which there are no transactions carried out by the memory controller on the first memory bus that involve the first storage array, the refresh logic to detect a pattern of activity on the first memory bus to identify a time to carry out the refresh operations and to determine which device of a plurality of devices will control the refresh operation;
a second memory bus coupled to the second interface; and
a second memory device having a second storage array comprised of a plurality of memory cells organized into rows and a second interface buffer coupled within the second memory device to the second storage array, wherein the second interface buffer provides a third interface by which the second memory device is coupled to the second memory bus forming a point-to-point connection between the third interface and the second interface, and a second refresh logic to carry out a refresh operation on a row within the second storage array during a period of time in which there are no transactions carried out by the memory controller on the second memory bus that involve the second storage array.

28. The computer system of claim 27, wherein the first refresh logic carries out a refresh operation on a row within the first storage array during a period of time in which a transaction between the memory controller and the second storage array occurs.

29. The computer system of claim 27, wherein the first refresh logic awaits a signal from the external memory controller to identify a dead time in which no commands involving the first storage array will be transmitted by the memory controller, providing an opportunity for the first refresh logic to carry out a refresh operation on a row within the first storage array without delaying the carrying out of an access command involving the first storage array.

30. The computer system of claim 29, wherein the memory controller is further comprised of a control register programmable by the processor to enable the transmitting of a signal by the memory controller to the first refresh logic to identify a dead time.

31. The computer system of claim 27, wherein the first refresh logic monitors the first memory bus for the occurrence of a powering down of the first memory bus, providing an opportunity for the first refresh logic to opportunistically carry out a refresh operation on a row within the first storage array without delaying the carrying out of an access command involving the first storage array.

* * * * *

UNITED STATES PATENT AND TRADEMARK OFFICE
CERTIFICATE OF CORRECTION

PATENT NO. : 7,353,329 B2 Page 1 of 1
APPLICATION NO. : 10/674981
DATED : April 1, 2008
INVENTOR(S) : Ellis et al.

It is certified that error appears in the above-identified patent and that said Letters Patent is hereby corrected as shown below:

In column 10, at line 34, claim 1 delete "and" and insert --out--.

Signed and Sealed this

Twenty-fourth Day of March, 2009

JOHN DOLL
*Acting Director of the United States Patent and Trademark Office*